United States Patent [19]
Fraenkel et al.

[11] Patent Number: 4,803,097
[45] Date of Patent: Feb. 7, 1989

[54] METAL PLATING OF PLASTIC MATERIALS

[75] Inventors: Howard A. Fraenkel, Lebanon, N.J.; Karen A. Davenport, Liverpool; Frank A. Spicciati, Baldwinsville, both of N.Y.

[73] Assignee: Allied-Signal Inc., Morris Township, Morris County, N.J.

[21] Appl. No.: 40,445

[22] Filed: Apr. 20, 1987

[51] Int. Cl.$^4$ ................................ B65D 3/10
[52] U.S. Cl. ...................... 427/307; 427/304; 427/305; 427/306; 427/383.1
[58] Field of Search ............... 427/306, 307, 304, 315, 427/383.1; 204/38.1

[56] References Cited

U.S. PATENT DOCUMENTS 4,422,907 12/1983 Bickmaier ..................... 427/306
4,528,245 7/1985 Jobbins ......................... 427/306
4,532,015 7/1985 Boultinghouse ............... 427/306
4,615,907 10/1986 Bocke ............................ 204/38.4

Primary Examiner—Janyce Bell
Attorney, Agent, or Firm—Richard C. Stewart; Gerhard H. Fuchs

[57] ABSTRACT

This invention relates to a process for conditioning the surfaces of natural and synthetic plastic materials for electroless plating of a metal coating thereon exposing such materials to an atmosphere comprising ozone, contacting said exposed materials with a conditioning solvent, such as an aqueous solution of sodium, potassium or lithium hydroxide, contacting said materials with one or more oxidizing acids such as nitric acid and electroless plating of a metal coating on the said material.

38 Claims, No Drawings

METAL PLATING OF PLASTIC MATERIALS

BACKGROUND OF THE INVENTION

1. Field of the Invention

This invention relates to a process for the conditioning of the surfaces of plastic materials and plastic articles and thereafter metal plating the conditioned surfaces through use of conventional electroless and electroplating techniques. This conditioning permits plating of said materials and articles to provide continuous metal plated surfaces which possess superior adhesive properties as compared to metal surfaces plated onto untreated surfaces. This invention also relates to products produced by the process of this invention.

2. Description of the Prior Art

In recent years, electroplating and metallic coating of plastics has become of ever increasing importance. In order to manufacture plastics having firmly bonded metal coatings, the plastic must be subjected to a pretreatment step, during which the surfaces of the plastic are treated to increase adhesion characteristics of metal surfaces coated thereon. Heretofore, various methods have been employed in such a pretreatment step. For example, in one such prior art method, the surfaces of the plastic are treated with a mixture of chromium trioxide, sulfuric acid and water, or a mixture of such ingredients and phosphoric acid. While relatively effective, this method suffers a number of disadvantages. For example, the efficiency of this method is very much dependent on the type of plastic to be treated; and accordingly it is mainly confined to use in the pretreatment of a narrow class of plastics. Thus, the process does not have universal applicability for a wide range of assorted plastics.

Another disadvantage of this known method is that the relative amounts of components in the chromium trioxide containing pre-treatment solution must be maintained within a pre-determined and rather narrow range of concentrations. Only deviations of a few percent from these optimum amounts are permissible. Otherwise, on subsequent chemical deposition of the metal, the plastic surface is not completely coated by the metal and/or the entire coating does not possess sufficiently high peel strength. In addition, in this known method, the pretreatment solution becomes useless as soon as the concentration levels of the degradation products of the plastic and of the trivalent chromium compounds in the solution reach a certain level. Thus, constant analytical supervision and dosing of the chemicals consumed and monitoring of the degradation products produced during the conduct of this known pretreatment method is required. This continual control of the process considerably complicates its conduct.

Still another disadvantage of this known pretreatment process results from difficulties associated with the disposal of the used composition. To eliminate the used pretreatment composition, it is necessary to reduce the hexavalent chromium compounds and then to neutralize the reduction product. In the neutralization procedure, large amounts of highly voluminous chromium hydroxide are formed, the removal of which considerably encumbers the disposal of the used composition. Thus, the disposal of the used pretreatment composition also complicates the conduct of the process and requires considerable expenditures of time, capital, technical apparatus and plants.

Lastly, the pretreatment composition of this known process is very corrosive, and extensive washings with water are required to completely remove it from the plastic surface being pretreated. The result is a further increase in process time and expense.

Another prior art process for pretreating plastic surfaces to enhance the peel strength of metal surfaces electroless or electroplated thereon is disclosed in U.S. Pat. No. 4,039,714. In this process, the surfaces of the plastic to be electroplated are pretreated by exposing them to an atmosphere containing sulfur trioxide. This known pretreatment process also suffers from several inherent disadvantages. For example, sulfur trioxide is an extremely toxic substance, which reacts with atmospheric moisture to form sulfuric acid which is extremely corrosive and dangerous. Thus, when using sulfur trioxide extreme care must be taken to prevent contact with human skin. Furthermore, sulfur trioxide reacts violently with certain organic materials producing heat, which results in an additional hazard to users of the process. The dangerous nature of sulfur trioxide results in an increase in the time, cost and equipment required to use this process.

U.S. Pat. No. 4,422,907 discloses an improvement in processes for pre-treatment of plastic surfaces for electroplating purposes. In the process of that patent, the surfaces of the plastic material are exposed to ozone and followed by washing with an aqueous alkali solution.

U.S. Pat. No. 4,528,245 discloses an improvement in the process of U.S. Pat. No. 4,422,907. In this improved process, the treated substrate is contacted with a surfactant to prolong the conditioning effect.

U.S. Pat. No. 4,532,015 describes poly(arylene sulfide) printed circuit boards. This patent discloses a process in which the board is etched with a strong oxidizing agent such as nitric acid coated with a metal coating through use of electroless plating techniques. This patent discloses that the peel strength of the plate is increased if the etched surface is allowed to age.

SUMMARY OF THE INVENTION

The present invention is directed to a method of treating plastic surfaces composed of polymeric materials to improve adhesion of a metal coating deposited upon said surfaces from an electroless plating bath, said method comprising the steps of:

(a) exposing said surfaces to an atmosphere comprising an "effective amount of ozone";

(b) contacting said exposed surfaces with an aqueous conditioning solvent selected from the group consisting of aqueous solutions comprising an "effective amount of one or more alcohols and one or more strong bases" and aqueous solutions of comprising an "effective amount of one or more strong bases"; and (c) contacting said surfaces with an "effective amount of one or more oxidizing agents"; and (d) depositing a metal coating onto said contacted surfaces from an electroless plating bath.

Polymer materials treated in accordance with the process of this invention are especially useful as the polymeric substrate in electroless plating processes. Such materials can be electroless plated after pretreatment to provide uniformly metal coated plastic surfaces having exceptionally high adhesive properties as compared to metal coated plastic surfaces in which the polmeric substrate has not been pre-treated and has been pretreated in prior art processes, as for example the processes described in U.S. Pat. Nos. 4,523,015;

4,038,714; 4,532,015; and 4,422,907. Following the electroless plating procedure additional metal can be plated onto the resulting metal plated surfaces through use of conventional electroplating or electroless plating techniques.

Plastic materials which have been pretreated and metal plated in accordance with this invention are useful for many purposes. For example, such metal plated plastic materials can be used for EMI/RFI shielding applications, for decorative purposes and/or for potection. Such metal plated plastics can also be used in the manufacture of printed circuit boards and to increase the strength and surface conductance of plastics. The process of this invention also provides parts which are considerably lighter than solid metal parts, yet which still possess metal conductive properties, metal surface characteristics and other like metal characteristics.

DETAILED DESCRIPTION OF THE INVENTION

The process of this invention includes four essential steps. In the first essential step, the surfaces of the plastic material to be pretreated are exposed to an atmosphere containing an "effective amount of ozone". As used herein, an "effective amount of ozone" is an amount of ozone which when contacted with the surfaces of a plastic material is effective to etch such surfaces such that subsequent treatment of said surfaces with an "effective amount of a conditioning solvent" (as hereinafter defined) and an "effective amount" (hereinafter defined) of one or more "effective oxidising agents" (hereinafter defined) followed by treatment of said surfaces with one or more electroless plating catalyst, and electroless plate of a metal coating on said treated surfaces will provide an electroless plated metal coating having enhanced adhesive properties as compared to the adhesive properties of metal coated onto untreated surfaces. While not intended to limit the scope of the invention in any way, it is believed that the ozone functions to etch the treated surfaces and the conditioning solvent then renders them hydrophilic. Normally, the greater the weight percent of ozone in the exposing atmosphere, the greater the degree of etching and the greater the increase in the hydrophilic character of the treated surfaces upon treatment with the conditioning solvent. Conversely, the less the amount of ozone in the exposing atmosphere, the less the degree of etching and the less the increase in the hydrophilic character of the treated surfaces upon treatment with the conditioning solvent. The quantity of ozone employed in a particular situation will depend on a number of factors, as for example the exposing temperature, the susceptibility of the particular plastic material to attack by ozone and the duration of exposure. Thus, variations in these parameters can greatly increase or decrease the speed and/or degree of etching and the extent to which the hydrophilic character of the plastic surfaces are modified; and thus, smaller or larger quantities of ozone can be employed depending on whether these operational parameters are maximized or minimized. In general, however, when employing preferred operational parameters, good results are achieved when the quantity of ozone is at least about 0.1 weight percent based on the total weight of gases in the exposing atmosphere surrounding the plastic surfaces being conditioned. In the preferred embodiments of this invention, the quantity of ozone which is employed is at least about 0.5 weight percent based on the total weight of gases in the atmosphere, and in the particularly preferred embodiments of this invention, the quantity of ozone is at least about 2.5 weight percent on the same basis. Amongst these particularly preferred embodiments, those in which the quantity of ozone is at least about 5.0 weight percent based on the total weight of gases are most preferred.

The upper weight percent of ozone is not critical, best results would be achieved if an atmosphere composed of 100% ozone is employed. However, due to the economics of ozone generation and/or the difficulty inherent in the generation of atmospheres composed of more than about 30 weight percent ozone, atmospheres composed of higher amounts of ozone are normally not used.

As is apparent from the foregoing, the ozone containing atmosphere is not 100% ozone and will most often include one or more inert carrier gases. Preferably this carrier gas is oxygen. However, other gases may also be used for this purpose including air, nitrogen, carbon dioxide, noble gases, mixtures of the foregoing gases and other gases which meet the requirement of nonreactivity with ozone.

Process temperatures employed in the first process step are not critical and can be varied as desired, provided, however, that the temperature is low enough to prevent substantial deformation of the plastic material being conditioned, and further provided that the temperature is high enough to allow favorable ozone on plastic reaction kinetics to occur. In addition, excessively elevated temperatures are preferably avoided so as to prevent or retard an unacceptably high reversion of ozone to oxygen. Because of these interacting phenomena, a strong relationship between ozonation temperatures, ozone concentrations and exposure time exists. When operating under preferred conditions, the process can be conveniently carried out at a temperature as low as about −30° C. and lower, and up to a temperature of about 200° C. and higher depending on the particular plastic material being etched. The process is usually carried out at a temperature of between about 20° C. and about 150° C., and preferably from about 50° C. to about 110° C.

Process pressures used in the first step are also not critical and can be varied widely. The process can be carried out at sub-atmospheric, atmospheric or super-atmospheric pressure. It is recognized, based on the principle of LeChatelier, that beneficial reaction characteristics can be brought about at super atmospheric pressures. However, the process is usually conducted at atmospheric or autogenous pressure for convenience.

In the first step of the process of this invention, the plastic material is exposed to the ozone atmosphere for a time sufficient to etch the surfaces of such material such that on subsequent treatment with the aqueous conditioning solvent, the hydrophilic nature of surface is established such that the adhesion of a metal coating electroless plated on said surfaces is improved to the extent desired. As was noted hereinabove, the duration of exposure will depend on a number of factors including, exposure temperatures, quantity of ozone in the exposing atmosphere and the like. Exposure times are not critical and can be varied over a wide range as desired provided that the aforementioned result is obtained. For example, exposure times can vary from about a few seconds up to about 24 hours or more. In most instances, however, exposure times will vary from about 1 to about 5 seconds up to about 1 to about 2 hours under the preferred process conditions, and these exposure times represent the preferred range of exposure times.

It should be appreciated that the preferred exposure time, exposure temperature and concentration of ozone in the exposing atmosphere for any particular application will depend on the type of plastic material being subjected to the process of this invention. Thus, the preferred set of process parameters for any particular application will preferably be selected in accordance with the chemical structure and reactivity of the plastic material in such a manner that optimum etching of the surface and changes in the hydrophilic character of the surface for a particular purpose is provided.

The method of producing the ozone containing atmosphere employed in the process of this invention is not critical and conventional procedures may be employed. For example, the ozone component can be generated from air, providing a useful atmosphere composed of ozone and air. Ozone generators are commercially available in differing sizes ranging from small laboratory models to very large generators used in water treatment. Any of these conventional types of generators can be employed in the practice of this invention. Ozone generators are especially useful in the conduct of the process of this invention in that they are easily turned on and off to generate ozone as required, and thus, their use can prevent the generation of large quantities of excess ozone. Even though ozone has no reported long term toxic effects, and can be detected by smell at concentrations as low as 0.1 ppm, it is generally advisable not to produce large excesses of any chemical. In the event that large excesses are produced, the unused ozone can be catalytically reduced to oxygen with manganese dioxide or alumina to prevent any potential pollution problems.

The plastic material selected for use in the process of this invention should contain functional groups which are susceptible to reaction with ozone and/or the oxidizing agent preferably those containing functional groups which are susceptible to attack by both the oxidizing agent and ozone. Such materials include naturally occurring polymers, and plastics and other synthetic polymeric materials which may be thermoplastic, thermosetting and elastomeric polymers. Illustrative of useful thermoplastic polymers are polyolefins, such as high or low density polyethylene, polypropylene, polyfluoroethylene, ethylene-propylene copolymers and the like; polyacetals; polyvinyl chloride and copolymers thereof; polyvinyl acetate, and the like; polysulfones; polysulfides, such as polyalkylene sulfides and polyarylene sulfides, polystyrenes and acrylonitrile-butadiene-styrene copolymers and the like; polyamides, such as poly(hexamethylene adipamide), polycaprolactam, poly(hexamethylene sebacamide), poly(undecamide), and the like; polyimides; polyesterimides; polyetherimides; polyestercarbonates; polyphenylene oxide; polycarbonates; polyacrylic polymers, such as poly(methacrylate), polyacrylic acid, polyacrylonitrile, and the like; cellulose esters; and polyurethanes or polyamideimides.

Thermoplastic polyamides can be used in the conduct of this invention as for example, the copolyamide of 30% hexamethylene diammonium isophthalate and 70% hexamethylene diamonium adipate, the copolyamide of up to 30% bis-(p-amidocyclohexyl)methylene, and terephthalic acid and caprolactam, poly(hexamethyleneadipamide) (nylon 66), poly(4-amidocyclohexyl acid) (nylon 4), poly(7-aminoheptanoic acid) (nylon 7), poly (8aminooctanoic acid) (nylon 8), poly(6-aminohexanoic acid) (nylon 6), poly(hexamethylene sebacamide) (nylon 6,10), poly(heptamethylene pimelamide) (nylon 7,7), poly(octamethylene suberamide) (nylon 8,8) poly (hexamethylene sebacamide) (nylon 6,10) poly (nonamethylene azelamide) (nylon 9,9), poly(decamethylene azelamide) (nylon 10,9), poly(decamethylene sebacamide (nylon 10,10), poly[bis(4-aminocyclohexyl)methane-1,10-decandeicarboxamide] ((Qiana) (trans)), poly(m-xylylene adipamide), poly(p-xylylene sebacamide), poly (2,2,2-trimethlhexamethylene terephthalamide), poly(piperazine sebacamide), poly(metaphenylene isophthalamide) (Nomex), poly(p-phenylene terephthalamide) (Kevlar), poly(11-aminoundecanoic acid) (nylon 11), poly(12-aminododecanoic acid) (nylon 12), polyhexamethylene isophthalamide, polyhexamethylene terephthalamide, poly (9-aminononanoic acid) (nylon 9) polycaproamide, or combinations thereof. Exemplary of thermoplastic polyesters which can be utilized in the practice of their invention are poly(ethylene phthalate), poly(cyclohexylenedimethylene terephthalate), poly(ethylene dodecate), poly(butylene terephthalate), poly[ethylene(2,7-naphthalate)], poly(metaphenylene isophthalate), poly(glycolic acid), poly(ethylene succinate), poly(ethylene adipate), poly(tetramethylene adipate), poly(ethylene azelate), poly(ethylene sebacate), poly(decamethylene adipate), poly(decamethylene sebacate), poly(a, a)-dimethylpropiolactone), poly(para-hydroxybenzoate) (Ekonol), poly(ethylene oxybenzoate) (A-tell), poly(ethylene isophthalate), poly(tetramethylene terephthalate), poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylidene dimethylene terephthalate) (Kodel) (cis), and poly(1,4-cyclohexylidene dimethylene terephthalate) (Kodel) (trans).

Exemplary of useful thermosetting polymers suitable for use in this invention are phenolic resins; aminoplastic; unsaturated polyesters; polyepoxides, and polyimides; and illustrative of useful elastomers are natural or synthetic rubbers, silicone rubbers, polyurethane elastomers and the like.

Preferred polymers for use in the process of this invention are polysulfides, polysulfones, and other polymers having a sulfur atom in the polymer backbone; polyacetals; and polyphenylene oxides. Particularly preferred polymers are polymers having sulfur linking groups in the polymer backbone, such as polysulfones and polysulfides. Amongst these particularly preferred embodiments, most prefered are poly(arylene sulfides) and poly(alkylene sulfides) without limitation thereto, uncured or partially cured, homopolymers, terpolymers or the like, or blends of such polymers. Poly(arylene sulfides) such as poly(phenylene sulfide), poly(2,4-tolylene sulfide), and poly(4,4'-biphenylene sulfide) are the polymers of choice. The most preferred poly(arylene sulfides) are known materials which can be prepared through use of known techniques as for example those described in U.S. Pat. No. 3,354,129 incorporated herein by reference, or obtained from commercial sources as for example from Phillips Chemical Company under the tradename Ryton ®.

In the second essential step of the process of this invention, the treated plastic surfaces are contacted with an aqueous conditioning solvent containing an "effective amount of one or more strong bases and one or more alcohols", or an effective amount of one or more "strong bases". As used herein "strong bases" are bases which form aqueous solutions having a pH of at least about 8, and preferably at least about 10. Exemplary of useful strong bases are of alkali and alkaline earth metal hydroxides and alkoxides, as for example, sodium hydroxide, potassium hydroxide, lithium hydroxide, sodium methoxide, sodium ethoxide, and nonmetal hydroxides as for example, ammonium hydroxide. Preferred strong bases for use in the practice of this invention are alkali metal hydroxides, and particularly preferred for use are sodium and potassium hydroxide. Illustrative of useful alcohols are ethanol, methanol, isobutanol, propanol, isopropanol, butanol and the like. Preferred alcohols are ethanol and methanol. In the particularly preferred embodiments of this invention, an aqueous ethanolic or methanolic solution of a strong inorganic base, as for example, sodium hydroxide, lithium hydroxide, potassium hydroxide, ammonium hydroxide and the like is employed is used as the conditioning solvent, and in the most preferred embodiments an aqueous methanolic or ethanolic solution of sodium hydroxide or potassium hydroxide is used as the conditioning solvent.

As used herein, an "effective amount of one more strong bases and one or more alcohols" and an "effective amount of one or more strong bases" is an amount of such materials in an aqueous conditioning solvent which when contacted with a plastic surface previously exposed to an effective amount of ozone is capable of removing the ozone/plastic degradation products from the ozone contacted surface to render the surface hydrophilic and to provide a treated surface on which a metal coating having improved peel strength can be deposited by conventional electroless and electrolytic plating techniques The concentration of base in both types of conditioning solvent is usually at least about 0.001 weight percent. In the preferred embodiments of the invention the concentration of base in the conditioning solvent is from about 0.001 weight to about 50 weight percent, based on the total weight of the solvent and in the particularly preferred embodiments is in the range of from about 10 to about 40 weight percent based on the total weight of the solvent. Amongst these particularly preferred embodiments, solvent having a base content of from about 15 to about 20 weight percent on the same basis are most preferred.

In general, in those embodiments of the invention in which the exposed surfaces are treated with the combination of one or more alcohols and one or more bases, the amount of the one or more alcohols contained in the solvent is at least about 2 weight percent based on the total weight of the solvent. In the preferred embodiments of the invention, the amount of the alcohols contained in the solution is from about 2 to about 80 weight percent based on the total weight of the solution, and in the particularly preferred embodiments of the invention, the amount of the alcohols is from about 10 to about 50 weight percent on the same bases. Amongst these particularly preferred embodiments of the invention, most preferred are those embodiments in which the amount of said one or more alcohols in said solution is from about 20 to about 40 weight percent based on the total weight of the solution. The amount of water in the solvent can vary widely and is usually at least about 5 weight percent based on the total weight of the solvent. In the preferred embodiments the amount of the water is from about 5 to about 80 weight percent, and in the particularly preferred embodiments is from about 20 to about 60 weight percent based on the total weight of the solvent.

After treatment with the effective amount of the conditioning solvent, the surfaces are treated with water or an aqueous acid solution, preferably aqueous hydrochloric acid. When the aqueous acid solution is used, the concentration of acid is at least about 0.1 weight percent based on the total weight of the solution. In the preferred embodiments of the invention, the concentration of acid in the solution is from about 0.2 to about 38 weight percent based on the total weight of the solution, and in the particularly preferred embodiments is from about 0.4 to about 20 weight percent on the aforementioned basis. Amongst these particularly preferred embodiments, most preferred are those in which the concentration of acid in the solution is from about 0.5 to about 5 weight percent based on the total weight of the solution.

After treatment, the surfaces may optionally be treated with an aqueous surfactant solution to prolong the effectiveness of the conditioning treatment as a function of time. In general, the amount of the one or more surfactants contained in the solution is at least about 0.0001 weight percent based on the total weight of the solution. The upper limit to the amount of surfactants is not critical, and is dictated primarily by economic considerations. In the preferred embodiments of the inventions, the amount of the surfactant contained in the solution is from about 0.0001 to about 20 weight percent based on the total weight of the solution, and in the particularly preferred embodiments of the invention, the amount of the surfactant is from about 0.001 to about 10 weight percent on the same basis. Amongst these particularly preferred embodiments of the invention, most preferred are those embodiments in which the amount of said one or more surfactants in said solution is from about 0.01 to about 1 weight percent based on the total weight of the solution.

The type of surfactant employed is not critical and can be varied widely. Useful surfactants may be amphoteric, anionic, cationic or nonionic in nature, or a combination of such surfactants can be employed.

Examples of suitable anionic surfactants are alkali metal, ammonium and amine soaps; the fatty acid part of such soaps contains preferably at least about 16 carbon atoms because soaps based on lauric and myristic acids have a greater tendency to develop an abundant foam as compared to soaps based on other fatty acids. Other examples of suitable anionic surfactants are alkali metal salts of alkyl-aryl sulfonic acids, sodium dialkyl sulfosuccinate, sulfated or sulfonated oils, e.g., sulfated castor oil; sulfonated tallow, and alkali salts of short chain petroleum sulfonic acids.

Examples of suitable cationic surfactants are salts of long chain primary, secondary, or tertiary amines, such as oleylamine acetate, cetylamine acetate, didodecylamine lactate, the acetate of aminoethyl-aminoethyl stearamide, dilauroyl triethylene tetramine diacetate, 1-aminoethyl-2-heptadecenyl imidazoline acetate; and quaternary salts, such as cetylpyridinium bromide, hexadecyl ethyl morpholinium chloride, and diethyl di-dodecyl ammonium chloride.

Examples of suitable nonionic surfactants are condensation products of higher fatty alcohols with alkylene oxides, such as the reaction product of oleyl alcohol with 10 ethylene oxide units; condensation products of alkylphenols with alkylene, octylphenol and nonyl phenol with from about 12 to about 30 ethylene oxide units; condensation products of higher fatty acid amides with 5 or more akylene oxide units each as ethylene oxide units; polyethyl glycol esters of long chain fatty acids, such as tetraethylene glycol monopalmitate, hexacthyleneglycol monolaurate, nonaethyleneglycol dioleate, tridecaethyl-eneglycol monoarachidate, tricosaethylene glycol monobehenate, tricosaethyleneglycol dibehenate, polyhydric alcohol partial higher fatty acids esters such as sorbitan tristearate, ethylene oxide condensation products of polyhydric alcohol partial higher fatty esters, and their inner anhydrides (mannitol-anhydride, called Mannitan, and sorbitol-anhydride, called Sorbitan), such as glycerol monopalmitate reacted with 10 molecules of ethylene oxide, pentaerythritol monooleate reacted with 12 molecules of ethylene oxide, sorbitan monostearate reacted with 10 to 15 molecules of ethylene oxide; long chain polyglycols in which one hydroxyl group is esterified with a higher fatty acid and the other hydroxy group is etherified with a low molecular alcohol, such as methoxypolyethylene glycol 550 monostearate (550 meaning the average molecular weight of the polyglycol ether). A combination of two or more of these surfactants may be used. For example, a cationic surfactant may be blended with a nonionic surfactant, or an anionic surfactant with a nonionic surfactant.

Preferred for use in the practice of this invention are nonionic surfactants, or mixtures of nonionic and anionic surfactants. Particularly preferred for use in the practice of this invention are non-ionic surfactants. Preferred non-ionic surfactants for use in the practice of his invention are alkylarylpolyethers, such as the condensation products of alkylphenols, such as octyphenol, nonylphenol and isooctylphenol, and alkylene oxides, such as ethylene oxide; fatty acid alkanol amides; polyalkoxylated alcohols, such as polyethoxylated 3-tridecanol, isotridecyl alcohol adduct with ethylene oxide; and fatty alcohol polyethers.

The temperature at which the post etching aqueous acid treatment or surfactant treatment is carried out is not critical and can be varied widely. Usually, this temperature will vary from about 0° C. to about 80° C. In the preferred embodiments of the invention the acid and/or treatment step is carried out at ambient temperature.

In addition, the treatment time is not critical and can be varied widely. Treatment times can be as short as 5 seconds and as long as one hour or more. Usually, however, treatment times are from about one to about five minutes.

In the third essential step of the process of this invention, the surfaces of the plastic material are pretreated with an "effective amount" of one or more "oxidising agents". As used herein, "oxidising agents" are those chemicals which are capable of oxidizing plastic surfaces. Exemplary of useful oxidizing agents are chemicals such as permanganate, peroxide, manganese dioxide, chromate, persulfate, thiosulfate, iodate, bromate, vanadol, fluorine gas, cerate, bromine gas, chlorine gas, oxygen, sulfur trioxide, perchlorate, and the like. Illustrative of such useful oxidizing agents are oxy/acids such as nitric acid, perchloric acid, phosphoric acid, chromic acid, chromous acid, hypophosphoric acid, pyrophosphoric acid, fuming sulfuric acid, boric acid, periodic acid, sulfuric acid, sulfurous acid, hypoiodic acid, hypobromic acid, iodic acid, bromic acid, peroxymonophosphoric acid, peroxydiphosphoric acid, nitrous acid and the like. Preferred for use in the practice of this invention are oxidizing acids. Amongst the preferred oxidizing acids particularly preferred are those oxidizing acids containing either nitrogen, phosphorous or sulfur, such as sulfuric acid, nitric acid, phosphoric acid, and peroxymonophosphoric acid and the like. Amongst these particularly preferred oxidising acids nitric acid is most preferred.

As used herein "an effective amount" of the oxidizing agent is an amount of the agent which when contacted with the surfaces of the plastic material which have been previously exposed to ozone followed by contact with the "conditioning solvent" is effective to condition such surfaces such that subsequent electroless plating of a metal thereon will provide a metal coating having enhanced peel strength as compared to the peel strength of metal coated onto untreated surfaces. Normally, the higher the concentration of the agent in the contacting composition, the greater the degree of etching. Conversely, the lower the concentration of agent in the contacting composition, the less the degree of etching. The concentration of agent employed in a particular situation will depend on a number of factors, as for example the exposing temperature, the susceptibility of the particular plastics material to attack by the agent; the duration of exposure and the like. Thus, variations in these parameters can greatly increase or decrease the speed and/or the extent of etching. Thus, smaller or larger quantities of agent can be employed depending on whether these operational parameters are maximized or minimized. In general, however, when employing preferred operational parameters, good results are achieved when the concentration of agent in the composition is at least about 0.5N. In the preferred embodiments of this invention, the concentration of agent in the composition is at least 2N and in the particularly preferred embodiments of this invention, the concentration of the agent in composition is at least about 3N. Amongst these particularly preferred embodiments, those in which the concentration of agent in composition is at least about 4N.

The upper concentration limit of agent is not critical provided that the oxidising activity of the agent is not so high as to unduly degrade the substrate at a particular contact time and temperature. In general, it is believed that best results can be achieved if the concentration of agent in the solution is high as possible when short contact times and low contact temperatures, i.e., from about 10° C. to about 30° C., are employed. Conversely, it is believed that lower concentrations should be utilized when longer contact times and higher contact temperatures, i.e., about 30° C. or higher, are employed.

The form in which the agents are used is not critical provided that sufficient contact is provided between the agent and the surface being conditioned. In the preferred embodiment of the invention, the agent is in aqueous form, or liquid form as for example a solution of the agent.

Process temperatures used in the third step of the process of this invention are not critical and can be varied widely as desired, provided that the temperature is low enough to prevent substantial degradation of the plastic material being conditioned and is high enough to allow the etching process to occur. As is indicated above there is a relationship between exposure times, exposure temperatures and the concentration of the agent in the exposing composition. Thus, the higher the exposure temperature, the shorter the exposure times and the lower the concentration of agent required to provide acceptable results, and, conversely, when lower temperatures are employed, longer exposure times and higher concentration agent may be required. When operating under prefered conditions, step three of the process can be conveniently carried out at a temperature as low as about $-10°$ C. and lower, and up to a temperature of about 200° and higher, depending on the particular plastic material being etched. The process is usually carried out at a temperature of between about 15° C. and about 150° C., preferably from about 20° C. to about 100° C., and more preferably from about 20° C. to about 50° C.

Process pressures used in the third step are also not critical and can be varied widely. The process can be carried out at subatmospheric, atmospheric or superatmospheric pressure. However, the process is usually conducted at atmospheric or autogenous pressure for convenience when the oxidizing agent is in solutions or in liquid form, while higher pressures may be employed if a gaseous oxidizing agent is used.

In the third step of the process of this invention, the plastic material is contacted by a composition comprising the effective amount of one or more oxidising agents for a time sufficient to etch the surfaces of such material such that on electroles plating of metal thereon the adhesion of the metal coating is improved to the extent desired. As was noted hereinabove, the duration of exposure will depend on the exposure temperatures, and the concentration of agent in the exposing composition. Exposure times can be varied over a wide range as desired provided that the aforementioned result is obtained. For example, exposure times can vary from about a few seconds up to about an hour or more. In most instances, however, exposure times will vary from 1 to 5 seconds up to about 5 to about 10 minutes under the preferred process conditions, and these exposure times represent the preferred range of exposure times.

It should be appreciated that the preferred exposure time, exposure temperature and concentration of acid in the exposing atmospher for any particular application will depend on the type of plastic material being subjected to the process of this invention. Thus, the preferred set of process parameters for any particular application will preferably be selected in accordance with the chemical structure and reactivity of the material in such a manner that optimum etching of the surface and changes in the hydrophilic character of the surface for a particular purpose is provided.

In the preferred embodiments of the invention, the ozidised surfaces are washed to remove any adhering oxidising agent, preferably with water and more preferably with distilled water, and thereafter all or a portion of the oxidation products are removed from the oxidised surfaces prior to deposition of the metal coating in the fourth essential step. In the particularly preferred embodiments at least about 50 percent of the oxidation of products are removed, and in the most preferred embodiments substantially all of the products are removed to allow for good contact between the non-oxidized surfaces and plating materials i.e., catalyst by metals in the next step. Methods for removing the oxidation products can vary widely, and include any conventional methods for removal of such products. Useful methods include abrasion with abrasive materials such as nitrides, glasses, sand, metallic and non-metallic oxides, emery and the like; sonification; and pressurized water flow.

In the fourth essential step of the process of this invention conditioned surfaces are electroless plated through use of conventional electroless metal plating procedures to provide polymeric materials and polymeric articles having a well adhering metal coatings as for example coatings of copper, brass, cadmium, chromium, nickel, gold, silver, platinum, zinc the and like, with enhanced peel strength. Procedures used in the electroless plating step are not critical and can vary widely. Useful procedures include any conventional electroless plating techniques. Additional metal layers can be applied to the metal coating through use of conventional electroless and/or electroplating techniques.

Polymeric materials treated in accordance with the process of this invention followed by conventional electroless plating, and optionally by electroplating, have many uses. For example, such plated surfaces can be used for EMI/RFI shielding on electronics housings as well as for decorative purposes. The metal surfaces also provide a protective covering against abrasion and the like. In addition, plastic materials metal plated in accordance with the process of this invention can be used in the manufacture of electronic components such as pin grid array integrated circuit carrier, printed circuit boards and the like. Such boards are flat plastic plates plated with metals such as copper and the like through use of conventional techniques.

EXAMPLE I to V

Samples of poly(phenylene sulfide) copolymer manufactured and marketed by Phillips Chemical Company under the trade designation Ryton ® R-10 are placed in sealed reaction chambers in the lab or pilot plant. The chambers are equipped with direct contact heating and circulation capabilities. Gas inlet and outlet orifices are provided enabling the passage of a carrier gas capable of etching the copolymer. The etchant employed in this reaction is ozone. The ozone is produced using a generator manufactured by the Welsbach Corporation and sold under the tradename Welsbach Laboratory Ozonator, Model T-23. The carrier gas is allowed to flow through the chamber at a constant rate of about 800 cc/min. Heating and circulation are initiated to quickly elevate the reaction temperature to 100° C. When the temperature is established, circulation is discontinued and ozone is introduced. This is the beginning of the reaction and the concentration of ozone in the reactor is essentially zero. The reaction is allowed to continue for about a 30 minute period. Circulation of the ozone is the reinitiated thus effecting a homogeneous ozone atmosphere having a final concentration of from about 0.81 to about 0.93 percent by weight. Ozone concentration is monitored using a model HC, PCI Ozone Corp. Ozone Analyzer.

Following ozone exposure, the samples are treated with an aqueous sodium hydroxide solution having a concentration of about one percent by weight for about 10 minutes at room temperature. After treatment with the base solution, the samples are rinsed with distilled water followed by rinsing with 1% hydrochloric acid and then oven dried.

The ozone treated surfaces were then etched with nitric acid by immersing the samples in concentrated nitric acid at 50° C. for three minutes. The etched surfaces are then washed with distilled water, and polished with hood sand (600 grit) and by sonication in distilled water.

Subsequent treatment involves electroless plating techniques which are as follows. In this technique, the samples are immersed in an aqueous activator solution containing 0.8% of Macuplex Activator D-34, from MacDermid Inc. (aqueous solution containig palladium, stannous, stannic, and hydrogen chloride) (hereinafter referred to as "D-34") and 20% concentrated hydrochloric acid at 28° C. for 2 to 5 minutes and rinsed for 1 minute in distilled water at room temperature. They are then immersed in an aqueous accelerator solution containing 10% of Macuplex Accelerator D-45, from MacDermid Inc. (aqueous solution containing HCl and stannic chloride) (hereinafter referred to as "D-45") at 50° C. for 2 minutes and again rinsed in water distilled for 1 minute at room temperature. The samples are then placed in an electroless copper or nickel plating bath. The copper bath is prepared by mixing 6% by volume Enplate Cu-750A (Enthone Inc.), 5% by volume Enplate Cu-750B (Enthone Inc.), 2.25% by volume Enplate Cu-750C (Enthone Inc.), and 0.5% by volume 37% formaldehyde. The samples are immersed in this bath for 15 minutes at 25° C. followed by a 1-minute rinse with water. The electroless nickel plating bath is prepared by mixing 6% by volume Enplate Ni-419A and 9% Enplate NI-419B, (Enthone Inc.). The pH of the solution is adjusted to about 8-8.9 with ammonium hydroxide. The samples are immersed in this bath for about 10 minutes at 25° C. followed by a 1-minute rinse with water. This is completed at 25° C. for about 5 minutes followed by a 1-minute rinse with water.

The samples are now plated electrolytically with copper as follows:

(1) These samples are first given a "copper strike" in which the samples are immersed in an air-agitated aqueous bath containing 45 g/L of copper sulfate, 5.5% by volume of sulfuric acid and 50 ppm of cupric chloride.

(2) Following the copper strike, the samples are placed in a bright acid copper bath for about 60 to 90 minutes at currents of from 0.42 to 0.56 amps to deposit copper plate. The bath is composed of 210 g/L copper sulfate, 3.2% by volume of sulfuric acid, 50 ppm of cupric chloride, 0.16% by volume of a conventional carrier/primary brightener, 0.16% by volume of a conventional brightener/leveler and 0.6% by volume of a conventional brightener/leveler support additive.

In some of the examples, the metal plated substrate is annealed by heating at 260° C.

The adhesion characteristics of electroless and electrolytic plate on the samples are then determined by subjecting the plated metal coatings to a "Peel Test" as follows:

1. Two parallel incisions approximately 25.00±0.25)m apart and approximately 75 mm long are cut in the electroplated metal coating, producing a strip.

2. Using a sharp chisel or knife, peel back an 15 mm tab of the strip.

3. Restrain the plaque in a way that permits separating the strip.

4. Attached the tab to a spring-loaded tester.

5. Separate the strip from the plaque at an angle of 90±5 deg to the plaque and at a rate of 25±3 mm/min.

6. During the separation the force on the indicator will rise to a peak value and fall back. The peak value is a peel value.

The results of the Peel Test are set forth in the following Table I.

TABLE 1

| Example No. | Peel Strength |
|---|---|
| *I | 21 lbs/in. |
| II | — |
| III | 6 lbs/in. |
| IV | 9 to 10 lbs/in. |
| **V | — |

*Annealed at 260° C.
**Annealed at 260° C. which resulted in delamination.

What is claimed is:

1. A process for metal plating a natural or synthetic plastic material to form a metal plated substrate having improved peel strength which process comprises:
    (a) exposing said material to an atmosphere comprising ozone;
    (b) contacting said exposed material with a conditioning solvent selected from the group consisting of aqueous conditioning solvents comprising an effective amount of one or more alcohols and one or more strong bases, and solvents comprising one or more strong bases;
    (c) contacting said material with an effective amount of one or more oxidizing agents;
    (d) depositing a metal coating upon said conditioned surface from an electroless plating bath to form said metal plated substrate; and
    (e) annealing the metal coated substrate.

2. A process according to claim 1 which further comprising depositing a metal coating upon said electroless plate metal coating from an electrolytic plating bath.

3. A process according to claim 1 wherein said material is selected from the group consisting of polymers having sulfur in the polymeric backbone.

4. A process according to claim 3 wherein said material is selected from the group consisting of poly sulfones and polysulfides.

5. A process according to claim 4 wherein said material is selected from the group consisting of polysulfides.

6. A process according to claim 5 wherein said material is selected from the group consisting of poly(arylene sulfides).

7. A process according to claim 6 wherein said material is poly(phenylene sulfide).

8. A process according to claim 1 wherein the quantity of ozone in said atmosphere is at least about 0.1 weight percent based on the total weight of the atmosphere.

9. A process according to claim 8 wherein the quantity of ozone is at least about 0.5 weight percent.

10. A process according to claim 9 wherein the quantity of ozone is at least about 2.5 weight percent.

11. A process according to claim 1 wherein said conditioning solvent comprises a aqueous solution of one or more strong inorganic bases.

12. An improved process according to claim 11 wherein said bases are selected from the group consisting of sodium hydroxide, lithium hydroxide, potassium hydroxide and ammonium hydroxide.

13. An improved process according to claim 12 wherein said one or more bases are selected from the group consisting of sodium hydroxide and potassium hydroxide.

14. An improved process according to claim 1 wherein said solvent comprises an aqueous solution of one or more strong inorganic bases and one or more alcohols are selected from the group consisting of alkanols having from 1 to about 7 carbon atoms.

15. An improved process according to claim 14 wherein said solution comprises a mixture of more than one alcohol.

16. An improved process according to claim 15 wherein said one or more alkanols are selected from the group consisting of ethanol, methanol, propanol and ispropanol.

17. An improved process according to claim 16 wherein said alcohol is ethanol or methanol.

18. An improved process according to claim 17 wherein said alcohol is ethanol.

19. A process according to claim 1 wherein the concentration of one or more alcohols in said solution is at least about 2 weight percent based on the total weight of the solution.

20. A process according to claim 19 wherein said concentration is from about 2 to about 80 weight percent.

21. A process according to claim 20 wherein said concentration is from about 10 to about 50 weight percent.

22. A process according to claim 21 wherein said concentration is from about 30 to about 40 weight percent.

23. A process according to claim 1 wherein the concentration of one or more strong bases is at least about 0.001 weight percent based on the total weight of the conditioning solvent.

24. A process according to claim 23 wherein said concentration is from about 0.001 to about 50 weight percent.

25. A process according to claim 24 wherein said concentration is from about 10 to about 40 weight percent.

26. A process according to claim 25 wherein said concentration is from about 15 to about 20 weight percent.

27. A process according to claim 1 wherein said oxidizing agent are selected from the group consisting of oxy acids.

28. A process according to claim 27 wherein said oxy acids are selected from the group consisting of oxy acids containing phosphorus, nitrogen and sulfur.

29. A process according to claim 28 wherein said oxy acids are selected from the group consisting of sulfuric acid, nitric acid, phosphoric acid and peroxymonophosphoric acid.

30. A process according to claim 1 wherein said oxidizing agent is nitric acid.

31. A process according to claim 1 wherein the said oxidizing agent is in a composition wherein the concentration of said agent is at least 0.5N.

32. A process according to claim 31 wherein said concentration is at least about 2N.

33. A process according to claim 32 wherein said concentration is at least about 4N.

34. An improved process for plating one or more metals onto the surfaces of a plastic material which comprises:
(a) exposing said material to an atmosphere containing ozone;
(b) contacting said exposed material with an aqueous conditioning solvent comprising an effective amount of one or more strong bases;
(c) reacting said material with an effective amount of nitric acid to form one or more reaction products on the surface of said material;
(d) removing all or a portion of said products from said surfaces; and
(e) coating said contacted material with a catalyst for electroless plating of metal thereon to form a metal coated substrate;
(f) depositing a metal coating on said catalyzed material by electroless plating; and
(g) annealing the metal coated substrate.

35. An improved process according to claim 34 and wherein said bases are selected from the group consisting of sodium hydroxide and potassium hydroxide.

36. An improved process according to claim 34 wherein said metal is selected from the group consisting of copper, silver, nickel and cobalt.

37. An improved process according to claim 34 which further comprises depositing one or more additional metal coatings onto said metal coated material of step (f) by electrolytic plating or electroless plating.

38. An improved process according to claim 37 wherein said one or more additional metals are selected from the group consisting of copper, nickel, silver and chromium.

* * * * *